US006781407B2

(12) United States Patent
Schultz

(10) Patent No.: US 6,781,407 B2
(45) Date of Patent: Aug. 24, 2004

(54) FPGA AND EMBEDDED CIRCUITRY INITIALIZATION AND PROCESSING

(75) Inventor: David P. Schultz, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 103 days.

(21) Appl. No.: 10/043,769

(22) Filed: Jan. 9, 2002

(65) Prior Publication Data

US 2003/0128050 A1 Jul. 10, 2003

(51) Int. Cl.$^7$ .............................. G06F 7/38; H01L 25/00
(52) U.S. Cl. .............................. 326/41; 326/38; 326/47; 716/16
(58) Field of Search .............................. 326/38, 39, 40, 326/41, 46, 47; 716/16

(56) References Cited

U.S. PATENT DOCUMENTS

| | | |
|---|---|---|
| 4,758,985 A | 7/1988 | Carter |
| 4,855,669 A | 8/1989 | Mahoney |
| 5,072,418 A | 12/1991 | Boutaud et al. |
| 5,142,625 A | 8/1992 | Nakai |
| RE34,363 E | 8/1993 | Freeman |
| 5,274,570 A | 12/1993 | Izumi et al. |
| 5,311,114 A | 5/1994 | Sambamurthy et al. |
| 5,339,262 A | 8/1994 | Rostoker et al. |
| 5,347,181 A | 9/1994 | Ashby et al. |
| 5,361,373 A | 11/1994 | Gilson |
| 5,457,410 A | 10/1995 | Ting |
| 5,473,267 A | 12/1995 | Stansfield |
| 5,500,943 A | 3/1996 | Ho et al. |
| 5,504,738 A | 4/1996 | Sambamurthy et al. |
| 5,537,601 A | 7/1996 | Kimura et al. |
| 5,543,640 A | 8/1996 | Sutherland et al. |
| 5,550,782 A | 8/1996 | Cliff et al. |
| 5,552,722 A | 9/1996 | Kean |
| 5,574,930 A | 11/1996 | Halverson, Jr. et al. |
| 5,574,942 A | 11/1996 | Colwell et al. |
| 5,581,745 A | 12/1996 | Muraoka et al. |
| 5,600,845 A | 2/1997 | Gilson |
| 5,652,904 A | 7/1997 | Trimberger |
| 5,671,355 A | 9/1997 | Collins |
| 5,705,938 A | 1/1998 | Kean |
| 5,732,250 A | 3/1998 | Bates et al. |
| 5,737,631 A | 4/1998 | Trimberger |

(List continued on next page.)

FOREIGN PATENT DOCUMENTS

| | | |
|---|---|---|
| EP | 0315275 A2 | 10/1989 |
| EP | 0 905 906 A2 | 3/1999 |
| EP | 1 235 351 A1 | 8/2002 |
| WO | WO 93 25968 A1 | 12/1993 |

OTHER PUBLICATIONS

Cary D. Snyder and Max Baron; "Xilinx's A-to-Z System Platform"; Cahners Microprocessor; The Insider's Guide to Microprocessor Hardware; Microdesign Resources; Feb. 26, 2001; pp. 1–5.

(List continued on next page.)

*Primary Examiner*—Daniel Chang
(74) *Attorney, Agent, or Firm*—H. C. Chan; Kim Kanzaki; Justin Liu

(57) ABSTRACT

Interconnecting logic provides connectivity of an embedded fixed logic circuit, or circuits, with programmable logic fabric of a programmable gate array such that the fixed logic circuit functions as an extension of the programmable logic fabric. The interconnecting logic includes interconnecting tiles and may further include interfacing logic. The interconnecting tiles provide selective connectivity between inputs and/or outputs of the fixed logic circuit and interconnect of the programmable logic fabric. The interfacing logic, when included, provides logic circuitry that conditions data transfers between the fixed logic circuit and the programmable logic fabric. In one operation, the programmable logic fabric is configured prior to the startup/boot sequence of the fixed logic circuit. In another operation, the fixed logic circuit is started up and is employed to configure the programmable logic fabric.

40 Claims, 11 Drawing Sheets

U.S. PATENT DOCUMENTS

| | | |
|---|---|---|
| 5,740,404 A | 4/1998 | Baji |
| 5,742,179 A | 4/1998 | Sasaki |
| 5,742,180 A | 4/1998 | DeHon et al. |
| 5,748,979 A | 5/1998 | Trimberger |
| 5,752,035 A | 5/1998 | Trimberger |
| 5,760,607 A | 6/1998 | Leeds et al. |
| 5,835,405 A | 11/1998 | Tsui et al. |
| 5,874,834 A | 2/1999 | New |
| 5,889,788 A | 3/1999 | Pressly et al. |
| 5,892,961 A | 4/1999 | Trimberger |
| 5,914,616 A | 6/1999 | Young et al. |
| 5,914,902 A | 6/1999 | Lawrence et al. |
| 5,933,023 A | 8/1999 | Young |
| 5,970,254 A | 10/1999 | Cooke et al. |
| 6,011,407 A | 1/2000 | New |
| 6,020,755 A | 2/2000 | Andrews et al. |
| 6,026,481 A | 2/2000 | New et al. |
| 6,096,091 A | 8/2000 | Hartmann |
| 6,154,051 A | 11/2000 | Nguyen et al. |
| 6,163,166 A | 12/2000 | Bielby et al. |
| 6,172,990 B1 | 1/2001 | Deb et al. |
| 6,181,163 B1 | 1/2001 | Agrawal et al. |
| 6,211,697 B1 | 4/2001 | Lien et al. |
| 6,242,945 B1 | 6/2001 | New |
| 6,272,451 B1 | 8/2001 | Mason et al. |
| 6,279,045 B1 | 8/2001 | Muthujumaraswathy et al. |
| 6,282,627 B1 | 8/2001 | Wong et al. |
| 6,301,696 B1 | 10/2001 | Lien et al. |
| 6,343,207 B1 | 1/2002 | Hessel et al. |
| 6,353,331 B1 | 3/2002 | Shimanek |
| 6,356,987 B1 | 3/2002 | Aulas |
| 6,389,558 B1 | 5/2002 | Herrmann et al. |
| 6,434,735 B1 | 8/2002 | Watkins |
| 6,460,172 B1 | 10/2002 | Insenser Farre et al. |
| 6,467,009 B1 | 10/2002 | Winegarden et al. |
| 6,483,342 B2 | 11/2002 | Britton et al. |
| 6,507,942 B1 | 1/2003 | Calderone et al. |
| 6,510,548 B1 | 1/2003 | Squires |
| 6,518,787 B1 * | 2/2003 | Allegrucci et al. ........... 326/38 |
| 6,519,753 B1 | 2/2003 | Ang |
| 6,522,167 B1 | 2/2003 | Ansari et al. |
| 6,532,572 B1 | 3/2003 | Tetelbaum |
| 6,539,508 B1 | 3/2003 | Patrie et al. |
| 6,541,991 B1 | 4/2003 | Hornchek et al. |
| 6,578,174 B2 | 6/2003 | Zizzo |
| 6,587,995 B1 | 7/2003 | Duboc et al. |
| 6,588,006 B1 | 7/2003 | Watkins |
| 6,601,227 B1 | 7/2003 | Trimberger |
| 6,604,228 B1 | 8/2003 | Patel et al. |
| 6,611,951 B1 | 8/2003 | Tetelbaum et al. |
| 2001/0049813 A1 | 12/2001 | Chan et al. |
| 2003/0062922 A1 * | 4/2003 | Douglass et al. ............. 326/39 |

OTHER PUBLICATIONS

Sayfe Kiaei et al., "VLSI Design of Dynamically Reconfigurable Array Processor–Drap," IEEE, Feb. 1989, pp. 2484–2488, V3.6, IEEE, 3 Park Avenue, 17th Floor, New York, NY 10016–5997.

Vason P. Srini, "Field Programmable Gate Array (FPGA) Implementation of Digital Systems: An Alternative to ASIC," IEEE, May 1991, pp. 309–314, IEEE, 3 Park Avenue, 17th Floor, New York, NY 10016–5997.

G. Maki et al., "A Reconfigurable Data Path Processor," IEEE, Aug. 1991, pp. 18–4.1 to 18–4.4, 3 Park Avenue, 17th Floor, New York, NY 10016–5997.

Jacob Davidson, "FPGA Implementation of Reconfigurable Microprocessor," IEEE, Mar. 1993, pp. 3.2.1–3.2.4, IEEE, 3 Park Avenue, 17th Floor, New York, NY 10016–5997.

Christian Iseli et al., "Beyond Superscaler Using FPGA's," IEEE, Apr. 1993, pp. 486–490, IEEE, 3 Park Avenue, 17th Floor, New York, NY 10016–5997.

P.C. French et al., "A Self–Reconfiguring Processor,"; IEEE, Jul. 1993, pp. 50–59, IEEE, 3 Park Avenue, 17th Floor, New York, NY 10016–5997.

Christian Iseli et al., "Spyder: A Reconfigurable VLIW Processor Using FPGA's," IEEE, Jul. 1993, pp. 17–24, IEEE, 3 Park Avenue, 17th Floor, New York, NY 10016–5997.

Michael J. Wirthlin et al., "The Nano Processor: A Low Resource Reconfigurable Processor," IEEE, Feb. 1994, pp. 23–30, IEEE, 3 Park Avenue, 17th Floor, New York, NY 10016–5997.

William S. Carter, "The Future of Programmable Logic and Its Impact on Digital System Design," Apr. 1994, IEEE, pp. 10–16, IEEE, 3 Park Avenue, 17th Floor, New York, NY 10016–5997.

Andre' Dehon, "DPGA–Coupled Microprocessors: Commodity ICs for the Early 21st Century,"IEEE, Feb. 1994, pp. 31–39, IEEE, 3 Park Avenue, 17th Floor, New York, NY 10016–5997.

Osama T. Albaharna, "Area & Time Limitations of FPGA-Based Virtual Hardware," IEEE, Apr. 1994, pp. 184–189, IEEE, 3 Park Avenue, 17th Floor, New York, NY 10016–5997.

U.S. patent application Ser. No. 09/858,732, Schulz, filed May 15, 2001.

Xilinx, Inc., "The Programmable Logic Data Book," 1994, Revised 1995, Xilinx, Inc., 2100 Logic Drive, San Jose, CA. 95124.

Xilinx, Inc., "The Programmable Logic Data Book," 1994, Revised 1995, pp. 2–109 to 2–117, Xilinx, Inc., 2100 Logic Drive, San Jose, CA. 95124.

Xilinx, Inc., "The Programmable Logic Data Book," 1994, Revised 1995, pp. 2–9 to 2–18; 2–187 to 2–199, Xilinx, Inc., 2100 Logic Drive, San Jose, CA. 95124.

Xilinx, Inc., "The Programmable Logic Data Book," 1994, Revised 1995, pp. 2–107 to 2–108, Xilinx, Inc., 2100 Logic Drive, San Jose, CA. 95124.

Christian Iseli et al., "AC++ Compiler for FPGA Custom Execution Units Synthesis," 1995, pp. 173–179, IEEE, 3 Park Avenue, 17th Floor, New York, NY 10016–5997.

International Business Machines, "PowerPC 405 Embedded Processor Core User Manual," 1996, 5th Ed., pp. 1–1 to X–16, International Business Machines, 1580 Rout 52, Bldg. 504, Hopewell Junction, NY 12533–6531.

Yamin Li et al., "Aizup–A Pipelined Processor Design & Implementation on Xilinx FPGA Chip," IEEE, Sep. 1996, pp. 98–106, 98–106, IEEE, 3 Park Avenue, 17th Floor, New York, NY 10016–5997.

Ralph D. Wittig et al., On Chip: An FPGA Processor with Reconfigurable Logic, Apr. 17, 1996, pp. 126–135, IEEE, 3 Park Avenue, 17th Floor, New York, NY 10016–5997.

Xilinx, Inc., "The Programmable Logic Data Book," Jan. 27, 1999, Ch. 3, pp. 3–1 to 3–50, Xilinx, Inc., 2100 Logic Drive, San Jose, CA 95124.

William B. Andrew et al., "A Field Programmable System Chip Which Combines FPGA & ASIC Circuitry," IEEE, May 16, 1999, pp. 183–186, IEEE, 3 Park Avenue, 17th Floor, New York, NY 10016–5997.

Xilinx, Inc., "The Programmable Logic Data Book," 2000, Ch. 3 pp. 3–1 to 3–117, Xilinx, Inc., 2100 Logic Drive, San Jose, CA 95124.

U.S. patent application Ser. No. 10/001,871, Douglass et al., filed Nov. 19, 2001.

U.S. patent application Ser. No. 09/991,412, Herron et al., filed Nov. 16, 2001.

U.S. patent application Ser. No. 09/991,410, Herron et al., filed Nov. 16, 2001.

U.S. patent application Ser. No. 09/968,446, Douglass et al., filed Sep. 28, 2001.

U.S. patent application Ser. No. 09/917,304, Douglass et al., filed Jul. 27, 2001.

*Xilinx, Inc.*, "The Programmable Logic Data Book," 2000, Ch 3, pp. 3–7 to 3–17; 3–76 to 3–87, Xilinx, Inc., 2100 Logic Drive, San Jose, CA. 95124.

*International Business Machines*, "Processor Local Bus" Architecture Specifications, 32–Bit Implementation, Apr. 2000, First Edition, V2.9, pp. 1–76, IBM Corporation, Department H83A, P.O. Box 12195, Research Triangle Park, NC 27709.

*Xilinx, Inc.*, Virtex II Platform FPGA Handbook, Dec. 6, 2000, v1.1, pp. 33–75, Xilinx, Inc., 2100 Logic Drive, San Jose, CA. 95124.

U.S. patent application Ser. No. 09/861,112, Dao et al., filed May 18, 2001.

* cited by examiner

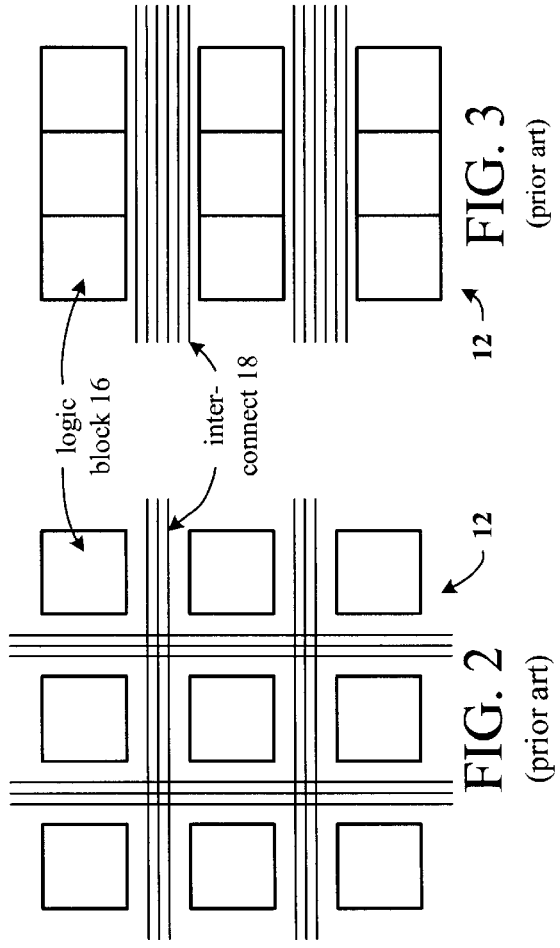
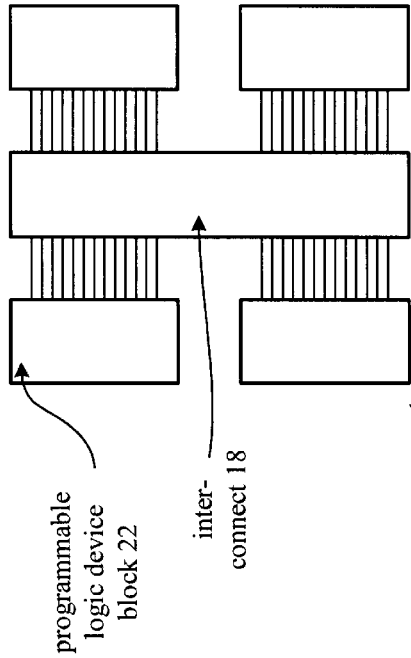
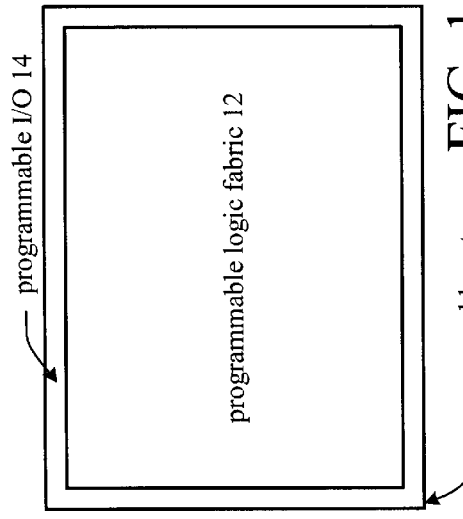
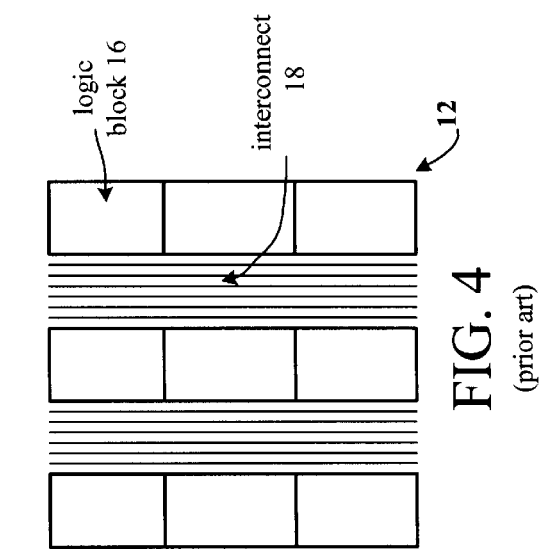

FPGA AND EMBEDDED CIRCUITRY INITIALIZATION AND PROCESSING

TECHNICAL FIELD OF THE INVENTION

The invention relates generally to field programmable gate arrays having embedded fixed logic circuitry; and, more particularly, it relates to the coordinated initialization and processing of the embedded fixed logic circuitry and the field programmable gate array.

BACKGROUND OF THE INVENTION

Programmable devices are a class of general-purpose integrated circuits that can be configured for a wide variety of applications. Such programmable devices have two basic versions, mask programmable devices, which are programmed only by a manufacturer, and field programmable devices, which are programmable by the end user. In addition, programmable devices can be further categorized as programmable memory devices or programmable logic devices. Programmable memory devices include programmable read only memory (PROM), erasable programmable read only memory (EPROM) and electronically erasable programmable read only memory (EEPROM). Programmable logic devices include programmable logic array (PLA) devices, programmable array logic (PAL) devices, erasable programmable logic devices (EPLD) devices, and programmable gate arrays (PGA).

Field programmable gate arrays (FPGA) have become very popular for telecommunication applications, Internet applications, switching applications, routing applications, and a variety of other end user applications. FIG. 1 illustrates a generic schematic block diagram of a field programmable gate array (FPGA) 10. The FPGA 10 includes programmable logic fabric 12 (containing programmable logic gates and programmable interconnects) and programmable input/output blocks 14. The programmable input/output blocks 14 are fabricated on a substrate supporting the FPGA 10 and are coupled to the pins of the integrated circuit, allowing users to access the programmable logic fabric 12. The programmable logic fabric 12 may be programmed to perform a wide variety of functions corresponding to particular end user applications. The programmable logic fabric 12 may be implemented in a variety of ways. For example, the programmable logic fabric 12 may be implemented in a symmetric array configuration, a row-based configuration, a column-based configuration, a sea-of-gates configuration, or a hierarchical programmable logic device configuration.

FIG. 2 illustrates the programmable logic fabric 12 implemented in accordance with a symmetrical array configuration. As shown, a plurality of logic blocks 16 is configured as an array of rows and columns. Each of the plurality of logic blocks 16 may be programmed by the end user to perform a specific logic function. More complex logic functions may be obtained by interconnecting individually programmed logic blocks using a plurality of programmable interconnections 18. Accordingly, between each of the logic blocks of each row and each column are programmable interconnections 18.

The programmable interconnections 18 provide the selective connectivity between the logic blocks of the array of logic blocks 16 as well as between the logic blocks and the programmable input/output blocks 14. The programmable interconnections 18 may be implemented using any programmable element, including static RAM cell technology, fuse and/or anti-fuse cell technologies, EPROM transistor technology, and/or EEPROM transistor technology. If the FPGA utilizes static RAM programmable connections, the connections can be made using a variety of components, including pass transistors, transmission gates, and/or multiplexers that are controlled by the static RAM cells. If the FPGA utilizes anti-fuse interconnections, the interconnections typically reside in a high impedance state and can be reprogrammed into a low impedance, or fused, state to provide the selective connectivity. If the FPGA utilizes EPROM or EEPROM based interconnections, the interconnection cells may be reprogrammed, thus allowing the FPGA to be reconfigured.

FIG. 3 illustrates a schematic block diagram of the programmable logic fabric 12 being implemented as a row based configuration. In this configuration, the programmable logic fabric 12 includes a plurality of logic blocks 16 arranged in rows. Between each row of the logic blocks are programmable interconnections 18. The interconnections may be implementing utilizing any programmable storage elements, including RAMs (static, dynamic and NVRAM), fuse and/or anti-fuse technologies, EPROM technology, and/or EEPROM technology.

FIG. 4 illustrates a schematic block diagram of the programmable logic fabric 12 being implemented as a column-based configuration. Logic blocks 16 and programmable interconnections 18 in FIGS. 3 and 4 are substantially similar.

FIG. 5 illustrates the programmable logic fabric 12 being implemented as a hierarchical programmable logic device. In this implementation, the programmable logic fabric 12 includes programmable logic device blocks 22 and programmable interconnections 18. As shown, four programmable logic block devices 22 are in the corners with an interconnection block 18 in the middle of the logic device blocks. In addition, the interconnections include lines coupling the programmable logic device blocks 22 to the interconnection block 18.

As is known, field programmable gate arrays allow end users the flexibility of implementing custom integrated circuits while avoiding the initial cost, time delay and inherent risk of application specific integrated circuits (ASIC). While FPGAs have these advantages, there are some disadvantages. For instance, an FPGA programmed to perform a similar function as implemented in an ASIC can require more die area than the ASIC. Further, the performance of a design using a FPGA may in some cases be lower than that of a design implemented using an ASIC.

One way to mitigate these disadvantages is to embed into an FPGA certain commonly used complex functions as fixed logic circuit. Therefore, a need exists for a programmable gate array that includes embedded fixed logic circuits yet retains programmable components.

SUMMARY OF THE INVENTION

The present invention involves a system and method for initiating an integrated circuit. The integrated circuit includes configurable logic blocks arranged and interconnected to form a programmable logic fabric that surrounds, at least in part, an opening. The integrated circuit also includes a fixed logic circuit, inserted into the opening such that the fixed logic circuit is surrounded by a number of the configurable logic blocks. In addition, the integrated circuit includes configuration logic which handles the programming and initialization of the programmable logic fabric and fixed logic. The fixed logic circuit and the programmable logic fabric are powered on and the fixed logic circuit is held in a known state. An entirety of the programmable logic fabric is then configured while the fixed logic circuit is held in the known state. Subsequently, the configuration logic initiates startup of the fixed logic circuit. After both the fixed logic circuit and the programmable logic fabric are fully enabled, they work together cooperatively. In this embodiment, the fixed logic circuit operates as a slave with respect to the configuration logic that operates as a master during configuration and startup. In a modification to these operations, the programmable fabric is partially configured, the fixed logic circuit is started up, and then the fixed logic circuit completes the configuration of the programmable fabric.

In an alternate embodiment, the fixed logic circuit operates as a master with respect to the programmable logic fabric that operates as a slave during startup and initialization. However, for this master/slave relationship to exist, the fixed logic circuit must be accessible from the input/output lines of the integrated circuit. However, the fixed logic circuit is embedded within the programmable logic fabric. Thus, according to this alternative embodiment, the fixed logic circuit is accessible via dedicated communication lines. In this embodiment, the fixed logic circuit may be directly accessed to initiate its power up and start up routines. Then, after the fixed logic circuit has been started up, it may be employed to configure the programmable logic fabric. According to this embodiment, the fixed logic circuit may investigate the operating conditions of the integrated circuit and configure the programmable logic fabric in a manner that is appropriate for the operating conditions.

The above-referenced description of the summary of the invention captures some, but not all, of the various aspect of the present invention. Other aspects, advantages and novel features of the invention will become apparent from the following detailed description of the invention when considered in conjunction with the accompanying drawings.

BRIEF DESCRIPTION OF THE DRAWINGS

A better understanding of the invention can be obtained when the following detailed description of various exemplary embodiments is considered in conjunction with the following drawings.

FIG. 1 illustrates a schematic block diagram of a prior art field programmable gate array;

FIG. 2 illustrates a schematic block diagram of the programmable logic fabric of the programmable gate array of FIG. 1 being implemented in a symmetrical array configuration;

FIG. 3 illustrates a schematic block diagram of the programmable logic fabric of the programmable gate array of FIG. 1 being implemented as a row based configuration;

FIG. 4 illustrates a schematic block diagram of the programmable logic fabric of the programmable gate array of FIG. 1 being implemented as a sea of gates configuration;

FIG. 5 illustrates a schematic block diagram of the programmable logic fabric of the programmable gate array of FIG. 1 being implemented as a hierarchical programmable logic device configuration;

DETAILED DESCRIPTION OF THE INVENTION

Figure 6:
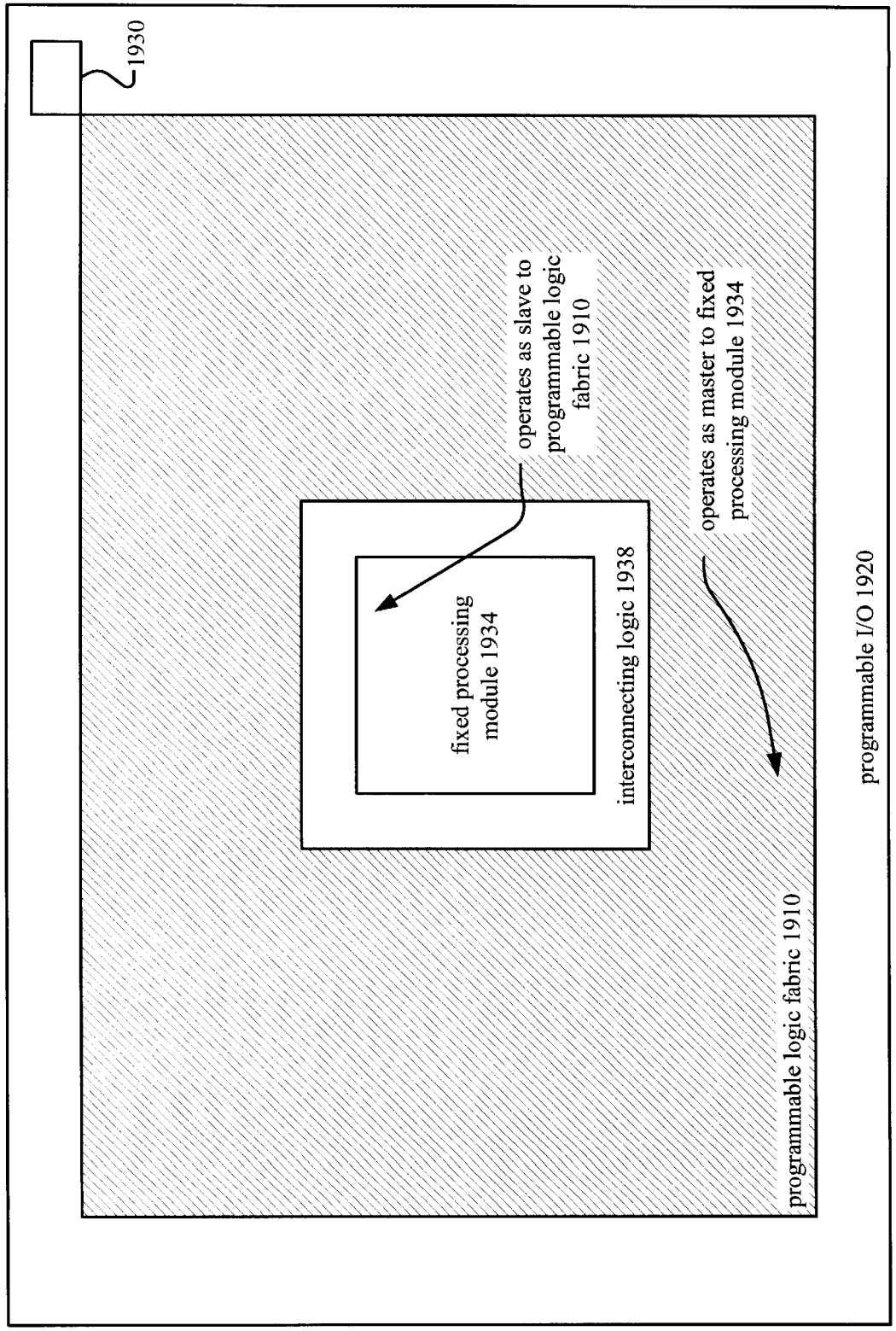
FIG. 6 is a system diagram illustrating an embodiment of an integrated circuit that is built in accordance with certain aspects of the present invention.

FIG. 6 is a system diagram illustrating an embodiment of an integrated circuit 1900 that is built in accordance with certain aspects of the present invention. The integrated circuit 1900 includes a plurality of programmable input/output circuits (shown collectively as 1920) that surround a programmable logic fabric 1910 and configuration logic 1930. A fixed processing module 1934 is placed within the programmable logic fabric 1910, and interconnecting logic 1938 enables communication between the fixed processing module 1934 and the programmable logic fabric 1910. The interconnecting logic 1938 may include a number of properly configured configurable logic blocks, including interconnecting tiles, and also various numbers of multiplexers as well. In addition, the interconnecting logic 1938 may also be designed such as to allow distribution among various of the configurable logic blocks along the periphery of the portion of the programmable logic fabric 1910 that has been removed to make place for the fixed processing module 1934. Detailed description of the interconnecting logic 1938 has been provided in a copending patent application entitled "Programmable Gate Array Having Interconnecting Logic To Support Embedded Fixed Logic Circuitry" (Ser. No. 09/968,446 and filed Sep. 28, 2001). The fixed processing module may include digital signal processors, physical layer interfaces, link layer interfaces, network layer interfaces, audio processors, video graphics processors, and applications specific integrated circuits.

In this particular embodiment, the fixed processing module 1934 operates as a slave to a configuration logic 1930 during startup and initialization. Likewise, the configuration logic operates as the master to the fixed processing module 1934 during startup and initialization. However, it is also noted that the master/slave relationship may also be reversed, so that the fixed processing module 1934 operates as the master to the configuration logic 1930, and the configuration logic 1930 operates as the slave to the fixed processing module 1934 during startup and initialization without departing from the scope and spirit of the invention. The fixed processing module 1934 of the FIG. 6 may be located centrally within the programmable logic fabric 1910, or alternatively, it may be located at any location appropriately chosen for use in a given application.

Figure 7:
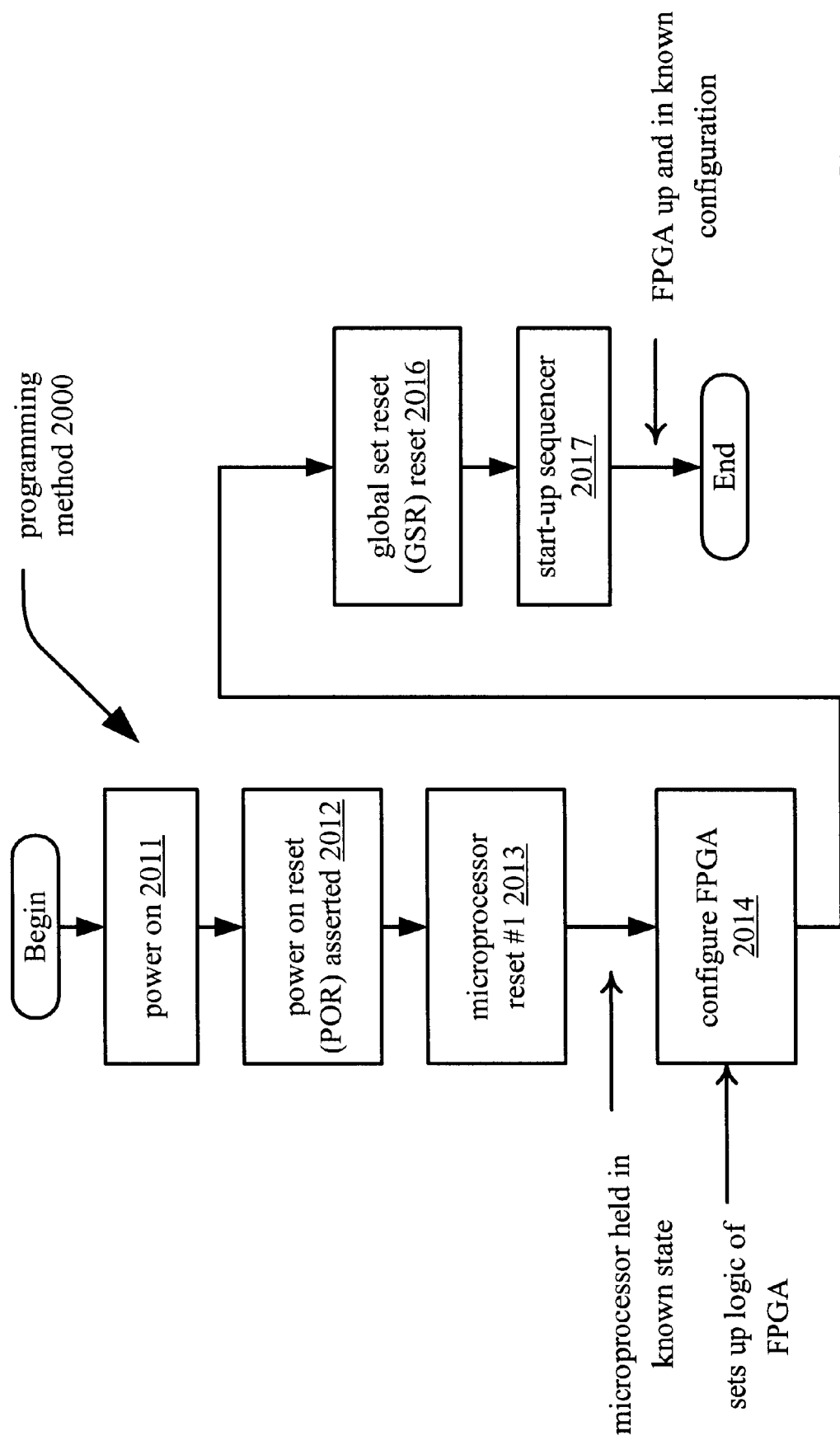
FIG. 7 is a logic diagram illustrating an embodiment of a programming method performed in accordance with certain aspects of the present invention.

FIG. 7 is a logic diagram illustrating an embodiment of a programming method 20000 performed in accordance with certain aspects of the present invention. In a block 2011, the integrated circuit is powered on. As will be seen in the various embodiments, the powering on may be partitioned into a number of steps, including partial powering up of the various components within an integrated circuit. Then, in a block 2012, a power on reset (POR) is asserted for the device. In a block 2013, a microprocessor reset #1 is made. The reset of the block 2013 ensures that the microprocessor is put in a known or predetermined state.

Then, in a block 2014, the gates within a field programmable logic array (FPGA) are configured as desired for a particular application. This operation may be viewed as being the configuration of the FPGA. The FPGA may also be referred to as being a programmable logic fabric in various embodiments as well.

Then, in a block 2016, a global system reset (GSR) is made. Ultimately, a start-up sequencer then begins operation as shown in a block 2017 in which the FPGA and microprocessor start-up sequences are initiated. Further, if other fixed logic devices are formed in the integrated circuit, these fixed logic devices would also be started up at step 2017. After the startup sequence, the FPGA is up and configured and in a known or predetermined logic configuration.

Figure 8:
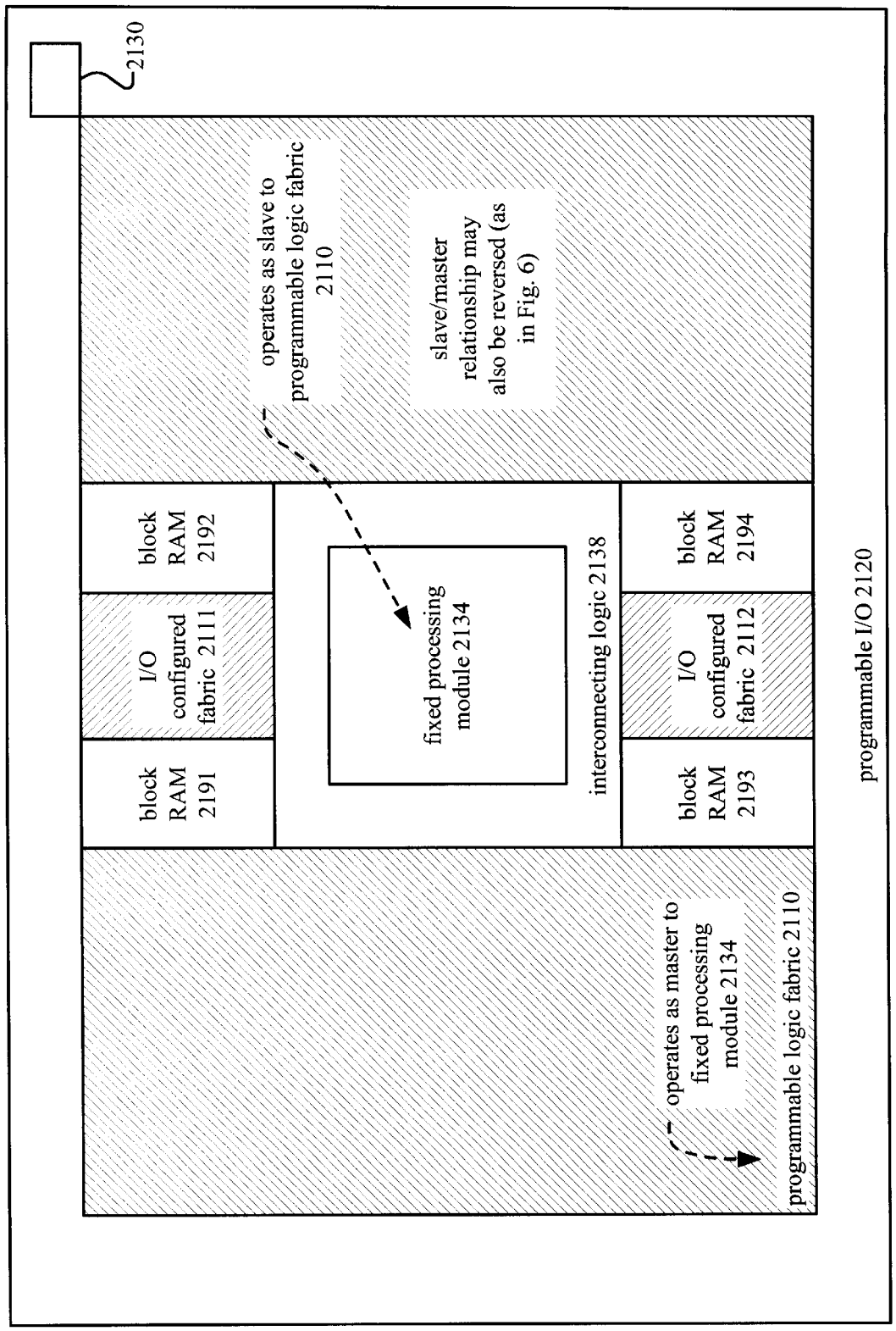
FIG. 8 is a system diagram illustrating another integrated circuit having strips of block RAM that operates according to the present invention.

FIG. 8 is a system diagram illustrating another integrated circuit 2100 having strips of block RAM that operates according to the present invention. The integrated circuit 2100 includes a programmable input/output circuit 2120 that surrounds a programmable logic fabric 2110 and configuration logic 2130. A fixed processing module 2134 is placed within the programmable logic fabric 2110, and interconnecting logic 2138 enables communication between the fixed processing module 2134 and the programmable logic fabric 2110.

It is also noted within the embodiment shown in the FIG. 8 that strips of block RAM (sometimes referred to as BRAM) are aligned to the top and bottom of the fixed processing module 2134 and its surrounding interconnecting logic 2138. This block RAM is operable to perform a number of functions, including storing states of configuration for one or both of the fixed processing module 2134 and the programmable logic fabric 2110. In addition, the block RAM may also be operable to serve as communication paths between the programmable input/output circuit 2120 that surrounds a programmable logic fabric 2110 and the fixed processing module 2134. In this particular embodiment, there are four strips of block RAM, shown as block RAM 2191, 2192, 2193, and 2194. The four strips of block RAM 2191, 2192, 2193, and 2194 are located to the top and bottom of the fixed processing module 2134 and its surrounding interconnecting logic 2138, and the strips of the block RAM extend to the edges of the fixed processing module 2134 and the programmable logic fabric 2110.

The block RAM 2191, 2192, 2193, and 2194 may also be used by the fabric 2110 during startup and initialization of the fixed processing module 2134. When the FPGA configuration logic 2130 acts as a master during startup and initialization (as described with reference to FIG. 7), the logic 2130 preloads the block RAM 2191, 2192, 2193, and 2194 with boot strap instructions for the fixed processing module 2134. Then, the logic 2130 initiates a fixed processing module 2134 restart sequence. In this restart sequence, the fixed processing module 2134 accesses the block RAM 2191, 2192, 2193, and 2194 for its startup instruction and data set. Further, in another operation according to the present invention, the logic 2130 preloads the block RAM 2191, 2192, 2193, and 2194 with instructions that will place the fixed processing module 2134 into a known state.

Figure 9:
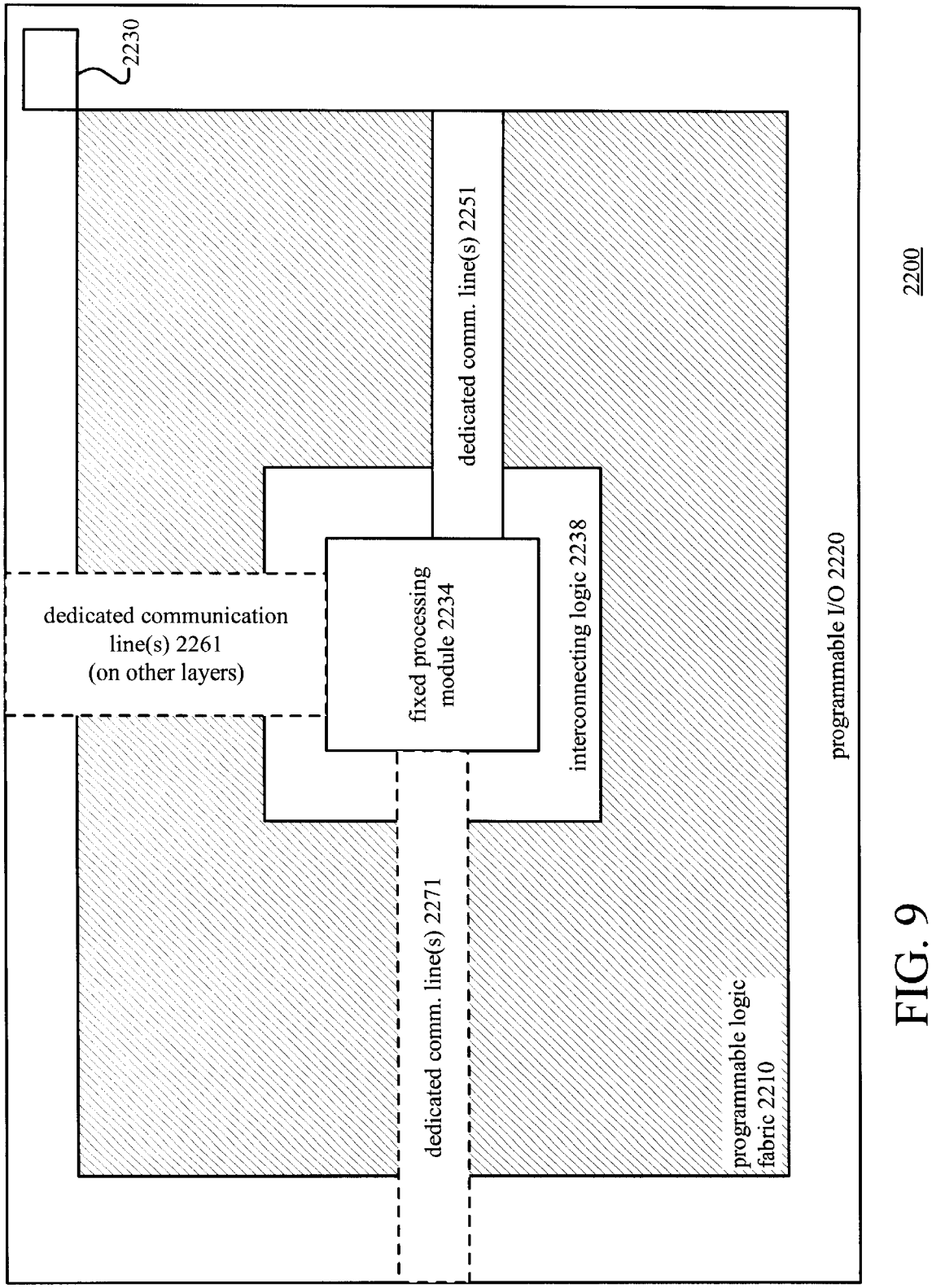
FIG. 9 is a system diagram illustrating another embodiment of an integrated circuit, having at least one dedicated communication line that is built in accordance with certain aspects of the present invention.

FIG. 9 is a system diagram illustrating another embodiment of an integrated circuit 2200, having at least one dedicated communication line that is built in accordance with certain aspects of the present invention. The integrated circuit 2200 includes a programmable input/output circuit 2220 that surrounds a programmable logic fabric 2210 and configuration logic 2230. A fixed processing module 2234 is placed within the programmable logic fabric 2210, and interconnecting logic 2238 enables communication between the fixed processing module 2234 and the programmable logic fabric 2210. Again as also described above in other of the various embodiments of the present invention, the interconnecting logic 2238 may include a number of properly configured configurable logic blocks, including interconnecting tiles, and also various numbers of multiplexers as well. In addition, the interconnecting logic 2238 may also be designed such as to allow distribution among various of the configurable logic blocks along the periphery of the portion of the programmable logic fabric 2210 that has been removed to make place for the fixed processing module 2234. The fixed processing module 2234 of the FIG. 9 may be located centrally within the programmable logic fabric 2210, or alternatively, it may be located at any location appropriately chosen for use in a given application.

In this particular embodiment, dedicated communication line(s) 2251 couple the programmable input/output circuit 2220 directly to the fixed processing module 2234. The dedicated communication line(s) 2251 includes as few as one dedicated communication line, or it may include any number of dedicated communication lines as well without departing from the scope and spirit of the invention. These dedicated communication line(s) 2251 allow access to the fixed processing module 2234 for any number of functional purposes. For example, they may be used to perform high-speed communication between the programmable input/output circuit 2220 and the fixed processing module 2234. Moreover, they may be used to facilitate powering up, start-up, booting, and initialization of the fixed processing module 2234 without requiring any interaction or operation of the programmable logic fabric 2210.

In addition, there may any number of other dedicated communication line(s), shown as dedicated communication line(s) 2261 and 2271 within the programmable logic fabric 2210. They may be located symmetrically around the fixed processing module 2234 and its interconnecting logic 2238 in certain embodiments. Alternatively, they may be located as desired within a given application. In this embodiment, there are three dedicated communication line(s) 2251, 2261, and 2271 that allow direct communicative coupling to the fixed processing module 2234 and its interconnecting logic 2238 from the programmable input/output circuit 2220 without requiring the interaction of the programmable logic fabric 2210. However, any other number of dedicated communication line(s) may be employed within other embodiments as desired in a given application or embodiment. With this structure, the fixed processing module 2234 may be first started up and initialized. Then, the fixed processing module 2234 may be employed to configure the FPGA fabric 2210.

Figure 10:
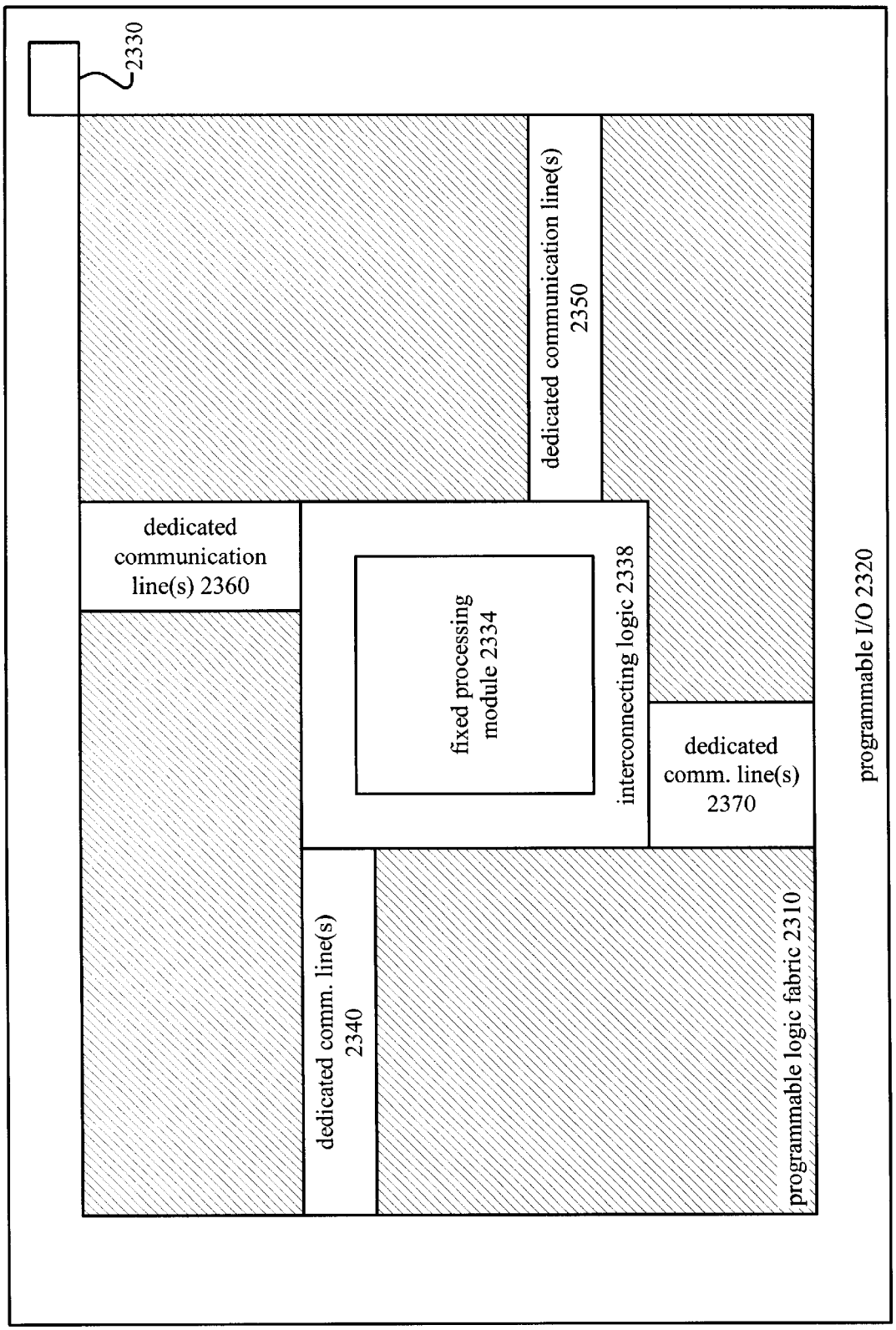
FIG. 10 is a system diagram illustrating yet another embodiment of an integrated circuit, having at least one dedicated communication line that is built in accordance certain aspects of the present invention.

FIG. 10 is a system diagram illustrating yet another embodiment of an integrated circuit 2300 having at least one dedicated communication line that is built in accordance certain aspects of the present invention. From certain perspectives, the integrated circuit 2300 may be viewed as being a variation of the integrated circuit 2200 in the FIG. 9. For example, the integrated circuit 2300 includes a programmable input/output circuit 2320 that surrounds a programmable logic fabric 2310 and configuration logic 2330. A fixed processing module 2334 is placed within the programmable logic fabric 2310, and interconnecting logic 2338 is operable to perform the communicatively coupling between the fixed processing module 2334 and the programmable logic fabric 2310. Again as also described above in other of the various embodiments of the present invention, the interconnecting logic 2338 may include a number of properly configured configurable logic blocks, including interconnecting tiles, and also various numbers of multiplexers as well. In addition, the interconnecting logic 2338 may also be designed such as to allow distribution among various of the configurable logic blocks along the periphery of the portion of the programmable logic fabric 2310 that has been removed to make place for the fixed processing module 2334. The fixed processing module 2334 of the FIG. 10 may be located centrally within the programmable logic fabric 2310, or alternatively, it may be located at any location appropriately chosen for use in a given application.

In this particular embodiment, four different paths of dedicated communication line(s) 2340, 2350, 2360, and 2370 communicatively couple the programmable input/output circuit 2320 directly to the interconnecting logic 2338 (and consequently to the fixed processing module 2334). This embodiment shown in the FIG. 10 differs from the embodiment of the FIG. 9, in that the dedicated communication line(s) only connect to the interconnecting logic 2338 and not directly to the fixed processing module 2334. However, the dedicated communication line(s) 2340, 2350, 2360, and 2370 may also be designed to allow direct connectivity to the fixed processing module 2334 in the FIG. 10 as well without departing from the scope and spirit of the invention. Similarly, the dedicated communication line(s) in the FIG. 9 may also be designed to allow connectivity only to the interconnecting logic 2238, and not to the fixed processing module 2234 of the FIG. 9 as well.

Each of the dedicated communication line(s) 2340, 2350, 2360, and 2370 may include as few as one dedicated communication line, or they each may include any number of dedicated communication lines, and the number of dedicated communication lines within each of them may be different as well without departing from the scope and spirit of the invention. These dedicated communication line(s) 2340, 2350, 2360, and 2370 allow access to the fixed processing module 2334 for any number of functional purposes. For example, they may be used to perform high speed communication between the programmable input/output circuit 2320 and the fixed processing module 2334. Moreover, they may be used to facilitate powering up, start-up, booting, and initialization of the fixed processing module 2334 without requiring any interaction or operation of the programmable logic fabric 2310.

The dedicated communication line(s) 2340, 2350, 2360, and 2370 may be located symmetrically around the fixed processing module 2334 and its interconnecting logic 2338 in certain embodiments. Alternatively, they may be located as desired within a given application. In this embodiment, there are four dedicated communication line(s) 2340, 2350, 2360, and 2370 that allow direct communicative coupling to the interconnecting logic 2338 (and consequently to the fixed processing module 2334) from the programmable input/output circuit 2320 without requiring the interaction of the programmable logic fabric 2310. However, any other number of dedicated communication line(s) may be employed within other embodiments as desired in a given application or embodiment.

Figure 11:
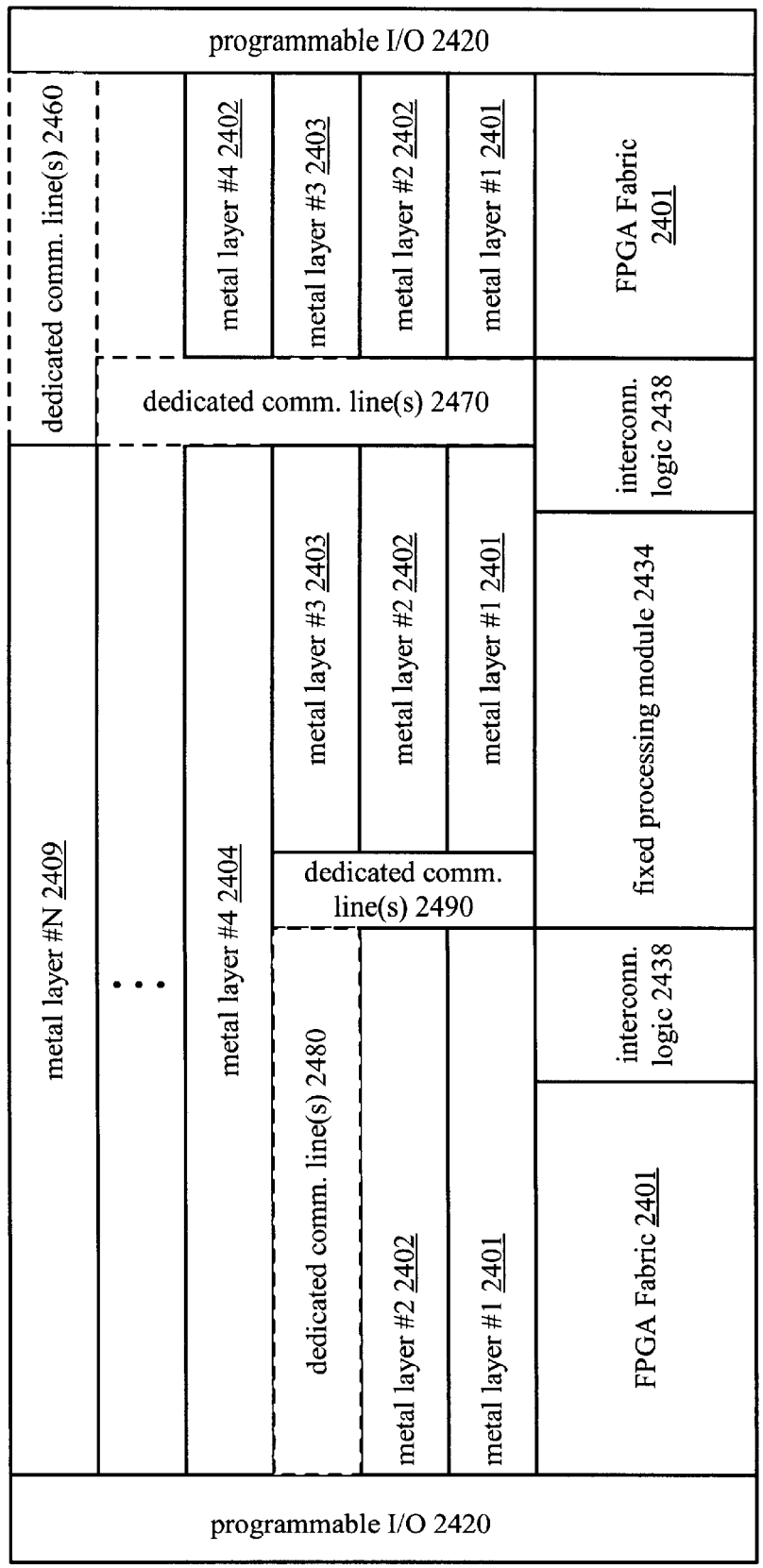
FIG. 11 is a diagrammatic cross-sectional representation of a multi-layer integrated circuit that is built in accordance certain aspects of the present invention.

FIG. 11 is a diagrammatic cross-sectional representation of an integrated circuit 2400 that is built in accordance certain aspects of the present invention. The integrated circuit 2400 includes a silicon (or other semi conductive) layer within which transistors that make up the FPGA fabric 2401, the fixed processing module 2434, and the interconnecting logic 2438 are formed. In one embodiment, a CMOS process is employed to form the plurality of transistors, and other required circuit elements. Such processes, as well as the structure of transistors and other circuit elements that make up these elements are generally known and will not be further described herein except as to expand upon the teachings of the present invention.

A plurality of metal layers, metal layer #1 2401, metal layer #2 2402, metal layer #3 2403, metal layer #4 2404, ..., and metal layer #n 2409 service the interconnectivity requirements of the integrated circuit. These interconnectivity requirements include FPGA Fabric 2401 interconnectivity requirements (as previously described herein with reference to the Figures), interconnectivity between the FPGA Fabric 2401 and the interconnecting logic 2438, interconnectivity between the fixed processing module 2434 and the interconnecting logic, and interconnectivity between the FPGA Fabric 2401 and the programmable I/O 2420. As is generally known, interconnectivity between particular circuit elements, e.g., transistors, resistors, etc., is created in one or more metal layers by coupling a line in the metal layers to two or more circuit elements with metal vias. The line(s) in the metal layers, when coupled by the vias makes an electrical connection between the circuit elements. The programmable I/O 2420 also is formed to include the plurality of metal layers 2401–2409 as well as programmable elements to create desired interconnectivity functions.

According to the present invention, one or more of the metal layers 2401–2409 is also employed to provide dedicated communication lines between the fixed processing module 2434 and/or interconnecting logic 2438 to the programmable I/O 2420. In this particular embodiment, any number of different paths of dedicated communication line(s) communicatively couple the programmable input/output circuit 2420 directly to the fixed processing module 2434 and/or interconnecting logic 2438 that surrounds the fixed processing module 2434. That is to say, the dedicated communication line(s) may communicatively couple only to the fixed processing module 2434 in certain embodiments. Alternatively, the dedicated communication line(s) may communicatively couple only to the interconnecting logic 2438 in other embodiments (as shown in FIG. 11). There may be embodiments where a combination of the two variations is included. The dedicated communication line(s) may be formed in a single metal layer or in multiple metal layers.

For example, as specifically shown in the FIG. 11, dedicated communication line(s) 2480 are formed in metal layer #3 2480 while dedicated communication line(s) 2460 are formed in metal layer #n 2409. Dedicated communication lines 2480 couple the programmable I/O 2420 to the fixed processing module 2434 by via 2490. Further, the dedicated communication lines 2460 couple the programmable I/O 2420 to the interconnecting logic 2438 by via 2470. The dedicated communication line(s) 2440 and 2450 illustrate the embodiment where there is communicative coupling between the programmable input/output circuit 2420 directly to both the fixed processing module 2434 and the interconnecting logic 2438. In other embodiments, dedicated communication lines may couple the programmable I/O 2420 only to the fixed processing module 2434 or the interconnecting logic 2438.

These dedicated communication lines provide direct access to the fixed processing module from the edge of the integrated circuit 2400. With this direct access available, the fixed processing module 2434 may be powered up and initialized prior to power up and configuration of the FPGA Fabric 2401. With the fixed processing module 2434 powered up and initialized first, it may be employed to configure the FPGA Fabric 2401. This order of start up and initialization provides designers with flexibility in programming the FPGA Fabric 2401. For example, the designer may designate a number of different FPGA Fabric 2401 configurations to choose from, depending upon particular operating conditions of the integrated circuit 2400. By first initializing the fixed processing module 2434 via the dedicated communication lines 2480 and 2460 (and associated vias 2490 and 2470, respectively), the fixed processing module 2434 may detect the operating condition and configure the FPGA Fabric 2401 accordingly. Further, at any time, the fixed processing module 2434 may reconfigure the FPGA Fabric 2401 as operating conditions change. By having the dedicated communication lines from the fixed processing module to the programmable I/O 2420 at the edge of the integrated circuit, the fixed processing module 2434 may reconfigure the FPGA fabric 2401.

It is noted that the interconnecting logic 2438 shown in the FIG. 11 completely surrounds the fixed processing module 2434. However, it may be designed such that the interconnecting logic 2438 is further partitioned into various portions that only partially surround the fixed processing module 2434. For example, the interconnecting logic 2438 on the right hand side of the fixed processing module 2434 in the FIG. 11 may actually not be connected to the interconnecting logic 2438 on the left hand side of the fixed processing module 2434 in other of the various embodiments without departing from the scope and spirit of the invention.

For many of the following figures in this patent application including the following figures, reference to a microprocessor may be used also interchangeably with fixed processing module, fixed logic circuit, and/or other fixed logic devices without departing from the scope and spirit of the invention. The terminology of microprocessor is used generically to represent a number of various fixed logic circuits. Similarly, the reference to an FPGA array may also include reference to a programmable logic fabric in various embodiments.

Figure 12:
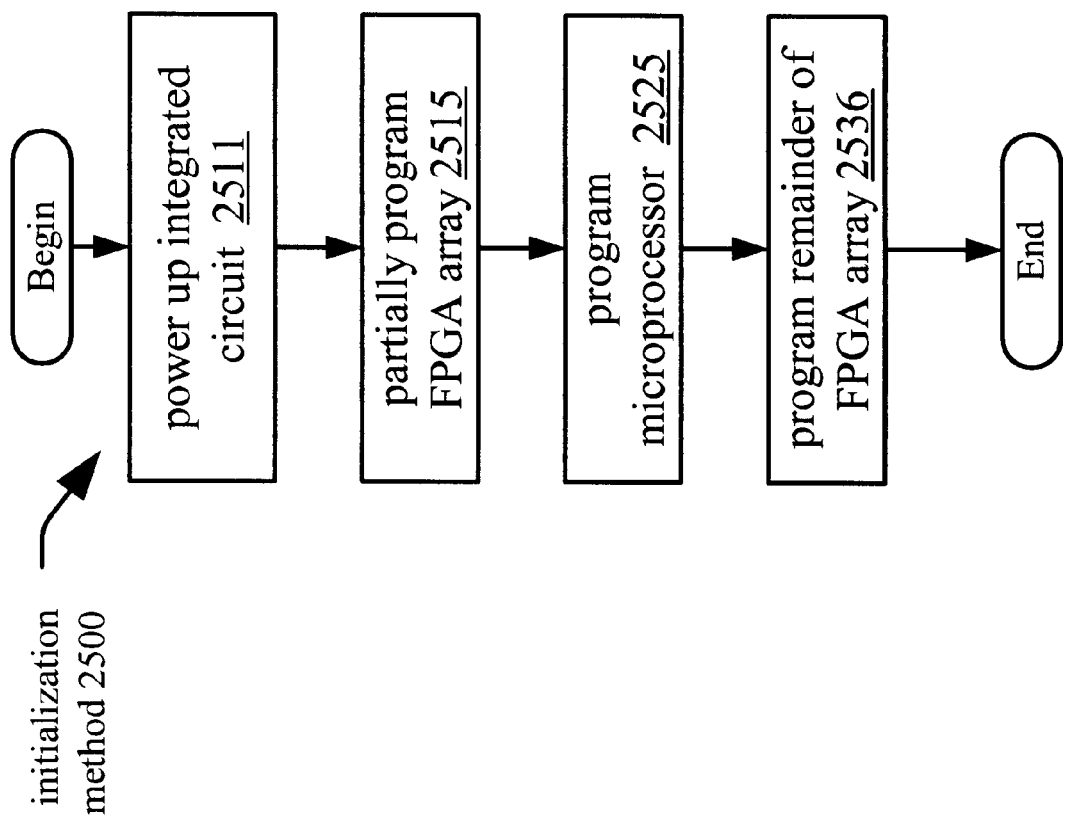
FIG. 12 is a logic diagram illustrating an embodiment of a startup and initialization method performed in accordance with certain aspects of the present invention.

FIG. 12 is a logic diagram illustrating an embodiment of an initialization method 2500 performed in accordance with certain aspects of the present invention. In a block 2511, the integrated circuit is powered up. Then, in a block 2515, the FPGA array is partially configured. Subsequently, in a block 2525, the microprocessor is programmed. In a block 2536, a remainder of the FPGA array (that was not partially configured in the block 2515) is then configured. This shows one of the various embodiments shown within the FIG. 12 for the initialization method 2500.

Figure 13:
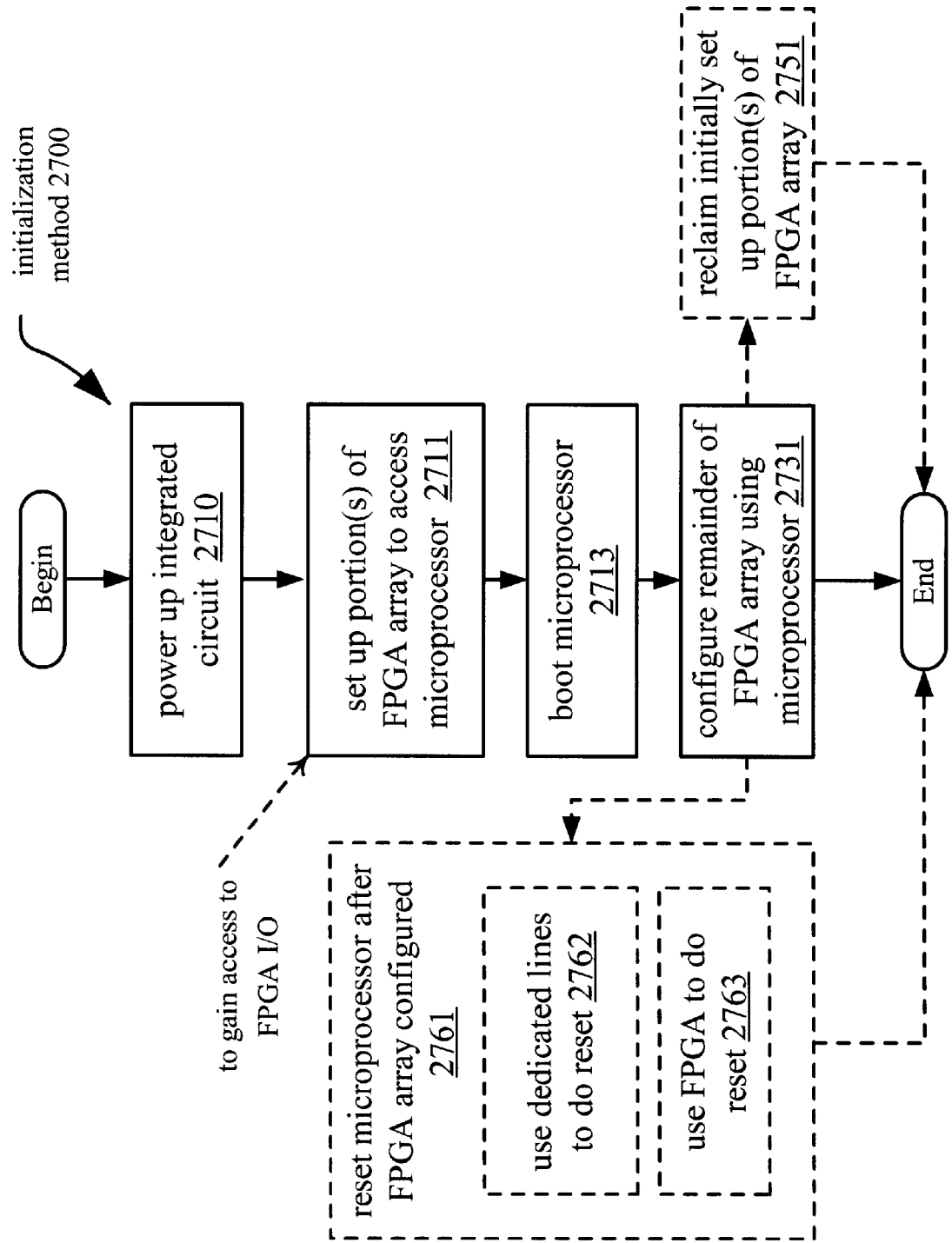
FIG. 13 is a logic diagram illustrating another embodiment of an initialization method performed in accordance with certain aspects of the present invention.

FIG. 13 is a logic diagram illustrating another embodiment of an initialization method 2700 performed in accordance with certain aspects of the present invention. Initially, in a block 2710, the integrated circuit is powered up. Then in a block 2711, one or more portion(s) of an FPGA array are set up to provide access to a microprocessor. This may be viewed as being performed to gain access to the microprocessor input/output functionality. Then, in a block 2713, the microprocessor is booted. In a block 2731, the remainder of the FPGA array is configured using the microprocessor. This may be viewed as directing the configuration of the remainder of the FPGA array using the microprocessor in the block 2731.

In alternative embodiments, one or more portion(s) of the FPGA array that were used to start up and boot the microprocessor may be reclaimed as shown in an alternative block 2751 before ending the initialization method 2700. In addition, the microprocessor may be reset after the FPGA array has been configured as shown in an alternative block 2761. To perform this reset of the microprocessor after the FPGA array has been configured, dedicated lines may be used to perform the reset of the microprocessor as shown in an alternative block 2762. Moreover, portions of the FPGA array may be used themselves to control the reset of the microprocessor. In addition, communicatively coupling via block RAM may also be used to perform the reset of the microprocessor as well.

Figure 14:
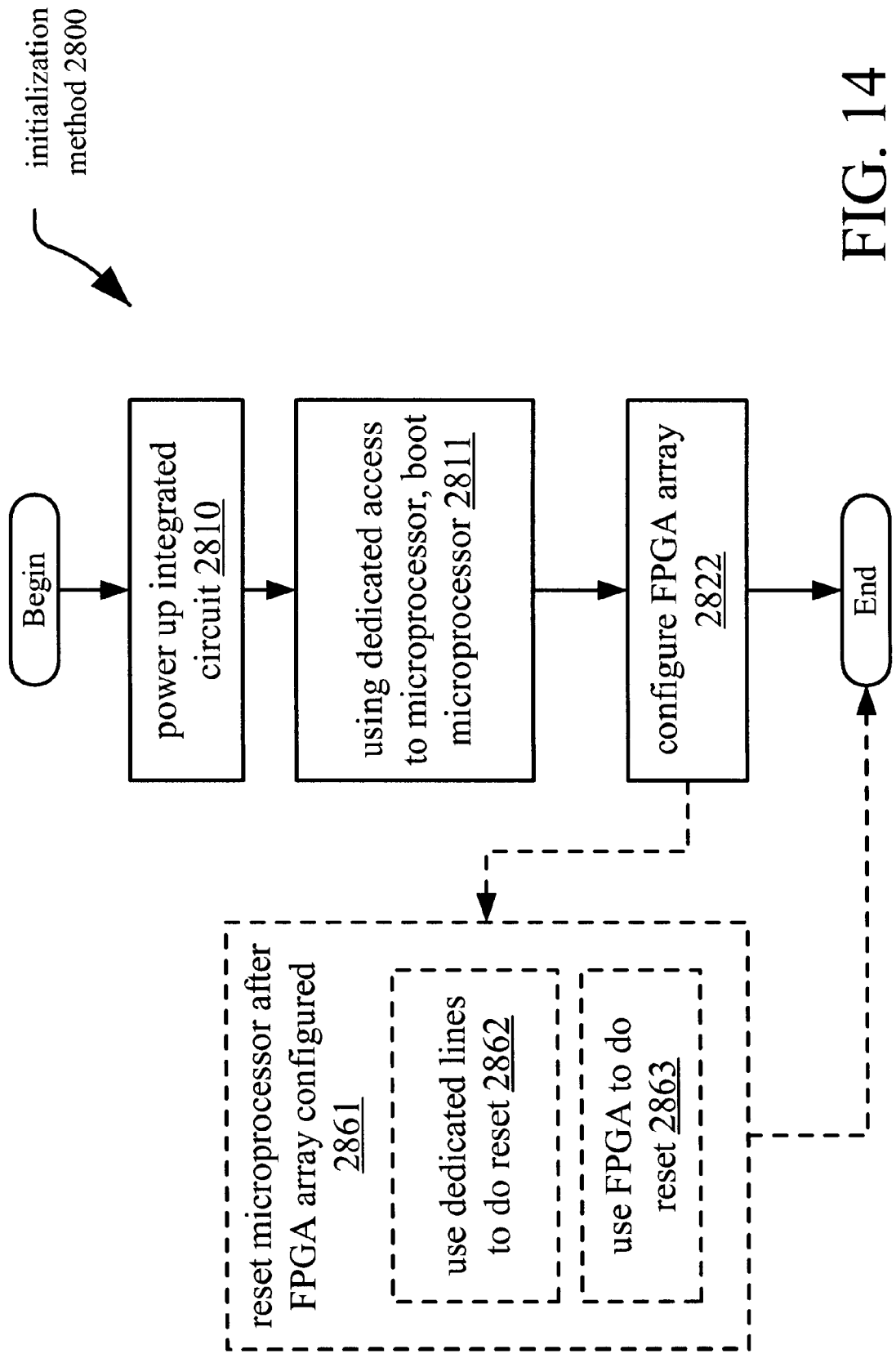
FIG. 14 is a logic diagram illustrating another embodiment of an initialization method performed in accordance with certain aspects of the present invention.

FIG. 14 is a logic diagram illustrating another embodiment of an initialization method 2800 performed in accordance with certain aspects of the present invention. In a block 2810, the integrated circuit is powered up. In a block 2811, a microprocessor is booted. This booting of the block 2811 is performed using dedicated access to the microprocessor in the FIG. 14. Then, the FPGA array is configured in the block 2822.

In addition, the microprocessor may be reset after the FPGA array has been configured as shown in an alternative block 2861. To perform this reset of the microprocessor after the FPGA array has been configured, dedicated lines may be used to perform the reset of the microprocessor as shown in an alternative block 2862. Moreover, portions of the FPGA array may be used themselves to control the reset of the microprocessor. In addition, communicatively coupling via block RAM may also be used to perform the reset of the microprocessor as well.

Figure 15:
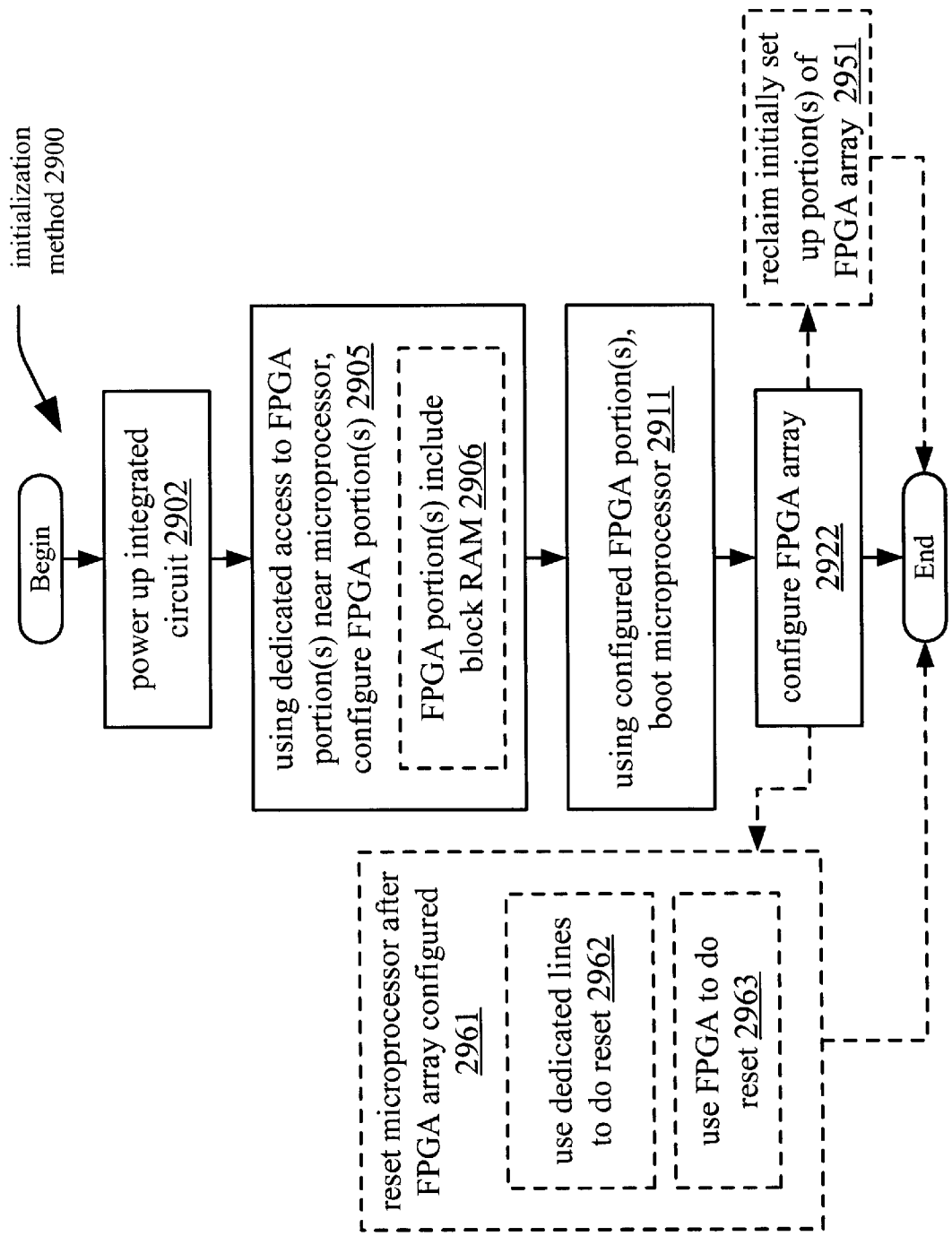
FIG. 15 is a logic diagram illustrating another embodiment of an initialization method performed in accordance with certain aspects of the present invention.

FIG. 15 is a logic diagram illustrating another embodiment of an initialization method performed in accordance with certain aspects of the present invention. In a block 2902, the integrated circuit is powered up. In a block 2905, one or more portion(s) of an FPGA array that are near a microprocessor are configured using dedicated access to the FPGA portion(s). Some of the FPGA portion(s) may also include block RAM as shown in an alternative block 2906. Then, in a block 2911, the microprocessor is booted using the configured portion(s) of the FPGA array.

In a block 2922, the FPGA array is configured. This may be viewed as performing the remaining configuration of the FPGA array. In alternative embodiments, one or more portion(s) of the FPGA array may be reclaimed as shown in an alternative block 2951 before ending the initialization method 2900. In addition, the microprocessor may be reset after the FPGA array has been configured as shown in an alternative block 2961. To perform this reset of the microprocessor after the FPGA array has been configured, dedicated lines may be used to perform the rest of the microprocessor as shown in an alternative block 2962. Moreover, portions of the FPGA array may be used themselves to control the reset of the microprocessor. In addition, communicatively coupling via block RAM may also be used to perform the reset of the microprocessor as well.

In view of the above detailed description of the invention and associated drawings, other modifications and variations will now become apparent to those skilled in the art. It should also be apparent that such other modifications and variations may be effected without departing from the spirit and scope of the invention.

What is claimed is:

1. A method for performing initialization of an integrated circuit, wherein the integrated circuit comprises a plurality of configurable logic blocks arranged and interconnected to form a programmable logic fabric that surrounds, at least in part, an opening and a fixed logic circuit, inserted into the opening such that the fixed logic circuit, is surrounded by a number of the plurality of configurable logic blocks, the method comprising powering on the fixed logic circuit and the programmable logic fabric;

holding the fixed logic circuit in a known state;

configuring the programmable logic fabric while the fixed logic circuit is held in the known state;

after the entirety of the programmable logic fabric is configured, starting-up the fixed logic circuit; and enabling cooperative processing involving the fixed logic circuit and the now-configured programmable logic fabric.

2. The method of claim 1, further comprising configuring an entirety of the programmable logic fabric while the fixed logic circuit is held in the predetermined state.

3. The method of claim 1, further comprising configuring a portion of the programmable logic fabric while the fixed logic circuit is held in the predetermined state to a degree.

4. The method of claim 3, further comprising partially booting the fixed logic circuit by using a configured portion of the programmable logic fabric; and wherein the fixed logic circuit is booted to a degree sufficient to direct the configuring of a remainder of the programmable logic fabric.

5. The method of claim 4, wherein info governing the partial booting of the fixed logic circuit is loaded from a block RAM.

6. The method of claim 4, further comprising configuring a remainder of the programmable logic fabric as directed by the fixed logic circuit.

7. The method of claim 6, further comprising:

booting a remainder of the fixed logic circuit;

reclaiming the configured portion of the programmable logic fabric by the fixed logic circuit; and reconfiguring the reclaimed portion of the programmable logic fabric to at least one additional configuration.

8. The method of claim 1, further comprising booting the fixed logic circuit using dedicated communication lines.

9. The method of claim 8, wherein the integrated circuit comprises a plurality of metal layers in which dedicated communication lines are formed; and wherein a substantial portion of the dedicated communication lines are located in a single metal layer within the plurality of metal layers.

10. The method of claim 1, wherein the fixed logic circuit is selected from the group consisting of digital signal processors, microprocessors, physical layer interfaces, link layer interfaces, network layer interfaces, audio processors, video graphics processors, and applications specific integrated circuits.

11. The method of claim 1, wherein the programmable logic fabric comprises block RAM arranged into a plurality of block RAM strips.

12. The method of claim 1, wherein the plurality of configurable logic blocks is arranged and interconnected to form the programmable logic fabric that surrounds, at least in part, at least one additional opening; and further comprising a high speed data interface is inserted into the at least one additional opening.

13. The method of claim 1, wherein the high speed data interface is located at an edge of the programmable logic fabric.

14. The method of claim 1, wherein the fixed logic circuit operates as a slave with respect to the programmable logic fabric that operates as a master.

15. The method of claim 1, wherein the fixed logic circuit operates as a master with respect to the programmable logic fabric that operates as a slave.

16. A method for performing initialization of an integrated circuit, wherein the integrated circuit comprises a plurality of configurable logic blocks arranged and interconnected to form a programmable logic fabric that surrounds, at least in part, an opening, and a fixed logic circuit inserted into the opening such that the fixed logic circuit, is surrounded by a number of the plurality of configurable logic blocks, and a programmable input/output circuit that substantially surrounds the programmable logic fabric, the method comprising:

configuring a portion of the programmable logic fabric as input/output logic to facilitate communication between the fixed logic circuit and the programmable input/output circuit;

powering on and booting the fixed logic circuit by signaling providing from the programmable input/output circuit via the input/output logic configured portion of the programmable logic fabric; and configuring a remainder of the programmable logic fabric.

17. The method of claim 16, wherein the integrated circuit further comprises interconnecting logic that is operable to perform interfacing between the fixed logic circuit and the number of the plurality of configurable logic blocks.

18. The method of claim 17, wherein the interconnecting logic comprises a multiplexer;

at least one configurable logic block of the plurality of configurable logic blocks employs a first plurality of communication lines and the fixed logic circuit employs a second plurality of communication lines; and the multiplexer is operable to facilitate communication between the fixed logic circuit and the at least one configurable logic block of the plurality of configurable logic blocks.

19. The method of claim 16, wherein the fixed logic circuit operates as a slave with respect to the programmable logic fabric that operates as a master.

20. The method of claim 16, wherein the fixed logic circuit operates as a master with respect to the programmable logic fabric that operates as a slave.

21. The method of claim 16, further comprising fully booting the fixed logic circuit by signaling provided from the programmable input/output circuit via the input/output logic configured portion of the programmable logic fabric.

22. The method of claim 16, further comprising partially booting the fixed logic circuit by signaling provided from the programmable input/output circuit via the input/output logic configured portion of the programmable logic fabric comprises a partial booting of the fixed logic circuit.

23. The method of claim 22, further comprising partially booting the fixed logic circuit to a degree sufficient to direct the configuring of the remainder of the programmable logic fabric.

24. The method of claim 16, wherein the plurality of configurable logic blocks is arranged and interconnected to form the programmable logic fabric that also surrounds, at least in part, at least one additional opening; and the integrated circuit further comprises a dedicated communication line, inserted into the at least one additional opening, to facilitate communication between the fixed logic circuit and the programmable input/output circuit.

25. The method of claim 24, wherein a portion of the booting of the fixed logic circuit is provided by signaling providing from the programmable input/output circuit via the dedicated communication line.

26. The method of claim 24, wherein the integrated circuit comprises a plurality of metal layers in which dedicated communication lines are formed; and wherein a substantial portion of the dedicated communication lines are located in a single metal layer within the plurality of metal layers.

27. The method of claim 16, wherein the fixed logic circuit is selected from the group consisting of digital signal processors, microprocessors, physical layer interfaces, link layer interfaces, network layer interfaces, audio processors, video graphics processors, and applications specific integrated circuits.

28. The method of claim 16, wherein the programmable logic fabric comprises block RAM arranged into a plurality of block RAN strips.

29. The method of claim 16, wherein the plurality of configurable logic blocks is arranged and interconnected to form the programmable logic fabric that surrounds, at least in part, at least one additional opening; and further comprising a high speed data interface, inserted into the at least one additional opening, such that the high speed data interface is surrounded by at least one additional number of the plurality of configurable logic blocks.

30. The method of claim 29, wherein the high speed data interface is located at an edge of the programmable logic fabric.

31. The method of claim 16, wherein a remainder of the programmable logic fabric is configured as directed by the fixed logic circuit.

32. A method for performing initialization of an integrated circuit, wherein the integrated circuit comprises a plurality of configurable logic blocks arranged and interconnected to form a programmable logic fabric that surrounds, at least in part, a first opening and a second opening, a fixed logic circuit, inserted into the first opening such that the fixed logic circuit, is surrounded by a number of the plurality of configurable logic blocks, a programmable input/output circuit that substantially surrounds the programmable logic fabric, and dedicated communication lines, inserted into the second opening, to facilitate communication between the fixed logic circuit and the programmable input/output circuit, the method comprising:

powering on the fixed logic circuit with signaling provided from the programmable input/output circuit via the dedicated communication lines; and booting the fixed logic circuit with signaling provided from the programmable input/output circuit via the dedicated communication lines.

33. The method of claim 32, further comprising configuring the programmable logic fabric before booting the fixed logic circuit.

34. The method of claim 32, further comprising configuring the programmable logic fabric after booting the fixed logic circuit.

35. The method of claim 32, further comprising configuring a portion of the programmable logic fabric before booting the fixed logic circuit; and configuring a remainder of the programmable logic fabric as directed by the fixed logic circuit.

36. The method of claim 32, wherein the integrated circuit comprises a plurality of metal layers in which dedicated communication lines are formed; and wherein a substantial portion of the dedicated communication lines are located in a single metal layer within the plurality of metal layers.

37. The method of claim 32, wherein the fixed logic circuit is selected from the group consisting of digital signal processors, microprocessors, physical layer interfaces, link layer interfaces, network layer interfaces, audio processors, video graphics processors, and applications specific integrated circuits.

38. The method of claim 32, wherein the programmable logic fabric comprises block RAM arranged into a plurality of block RAM strips.

39. The method of claim 32, wherein the plurality of configurable logic blocks is arranged and interconnected to form the programmable logic fabric that surrounds, at least in part, a third opening; and the integrated circuit further comprises a high speed data interface that is inserted into the third opening.

40. The method of claim 39, wherein the high speed data interface is located at an edge of the programmable logic fabric.

\* \* \* \* \*